United States Patent
Rauline

(10) Patent No.: US 9,232,677 B2
(45) Date of Patent: Jan. 5, 2016

(54) CHASSIS FOR STORAGE DEVICES

(71) Applicant: Jean Paul Rauline, Levallois-Perret (FR)

(72) Inventor: Jean Paul Rauline, Levallois-Perret (FR)

(73) Assignee: Seagate Technology LLC, Cupertino, CA (US)

( * ) Notice: Subject to any disclaimer, the term of this patent is extended or adjusted under 35 U.S.C. 154(b) by 165 days.

(21) Appl. No.: 14/027,200

(22) Filed: Sep. 14, 2013

(65) Prior Publication Data

US 2015/0077923 A1    Mar. 19, 2015

(51) Int. Cl.
*H05K 7/14*    (2006.01)
*G11B 33/12*    (2006.01)

(52) U.S. Cl.
CPC ............ *H05K 7/1489* (2013.01); *G11B 33/126* (2013.01); *G11B 33/128* (2013.01)

(58) Field of Classification Search
CPC ........................ H05K 7/20727; H05K 7/1487
USPC ......................................... 361/679.39, 679.33
See application file for complete search history.

(56) References Cited

U.S. PATENT DOCUMENTS

| | | | | |
|---|---|---|---|---|
| 5,506,750 A * | 4/1996 | Carteau et al. | ........... | 361/679.32 |
| 5,519,573 A * | 5/1996 | Cobb et al. | ............... | 361/679.32 |
| 5,640,302 A * | 6/1997 | Kikinis | ..................... | 361/679.41 |
| 5,822,184 A * | 10/1998 | Rabinovitz | ............... | 361/679.31 |
| 6,392,884 B1 * | 5/2002 | Chou | ....................... | 361/679.33 |
| 6,549,414 B1 * | 4/2003 | Tokuhara et al. | ............ | 361/719 |
| 6,618,249 B2 * | 9/2003 | Fairchild | .................. | 361/679.31 |
| 6,621,693 B1 * | 9/2003 | Potter et al. | .............. | 361/679.33 |
| 6,795,309 B2 * | 9/2004 | Hartung et al. | ............ | 361/679.4 |
| 6,853,548 B2 * | 2/2005 | Vanderheyden et al. | | 361/679.02 |
| 7,106,577 B2 * | 9/2006 | Shih | ......................... | 361/679.33 |
| 7,145,770 B1 * | 12/2006 | Zimlin et al. | ............ | 361/679.33 |
| 7,177,146 B2 * | 2/2007 | Cheng | ...................... | 361/679.35 |
| 7,200,004 B2 * | 4/2007 | Chen et al. | ............... | 361/679.39 |
| 7,361,081 B2 * | 4/2008 | Beitelmal et al. | ............. | 454/184 |
| 7,362,572 B1 * | 4/2008 | Wierzbicki et al. | ........... | 361/695 |
| 7,403,390 B2 * | 7/2008 | Franz et al. | ................... | 361/695 |
| 7,486,526 B1 * | 2/2009 | Frangioso et al. | ............ | 361/788 |
| 7,515,413 B1 * | 4/2009 | Curtis | .......................... | 361/695 |
| 7,715,182 B2 * | 5/2010 | Signer et al. | ............. | 361/679.33 |
| 7,715,184 B2 * | 5/2010 | Yang | ......................... | 361/679.37 |
| 8,014,144 B2 * | 9/2011 | Cheng et al. | ............. | 361/679.33 |
| 8,120,922 B2 * | 2/2012 | Randall et al. | ................ | 361/725 |
| 8,400,765 B2 * | 3/2013 | Ross | ........................ | 361/679.33 |
| 8,427,823 B2 * | 4/2013 | Yamada | .................... | 361/679.39 |
| 8,472,183 B1 * | 6/2013 | Ross et al. | ................. | 361/679.5 |
| 8,477,491 B1 * | 7/2013 | Ross et al. | ................. | 361/679.5 |
| 8,508,928 B2 * | 8/2013 | Killen et al. | ............. | 361/679.33 |

(Continued)

OTHER PUBLICATIONS

AAEON Electronics, Inc.. High Density 1U Storage Server, CRS-300S-2R datasheet, accessed Sep. 5, 2013 (www.aaeonusa.com/download/datasheet/CRS-300S-2R.pdf).

(Continued)

*Primary Examiner* — David M Sinclair
*Assistant Examiner* — Robert Brown

(57) ABSTRACT

Provided herein is an apparatus, including a chassis defining a storage compartment; a printed circuit board, wherein the printed circuit board is substantially parallel to a floor of the storage compartment; and a number of connectors mounted on the printed circuit board, wherein the number of connectors are configured to respectively connect to a number of digital data storage devices oriented substantially parallel to the printed circuit board.

20 Claims, 6 Drawing Sheets

(56) References Cited

U.S. PATENT DOCUMENTS

Figure 1A:
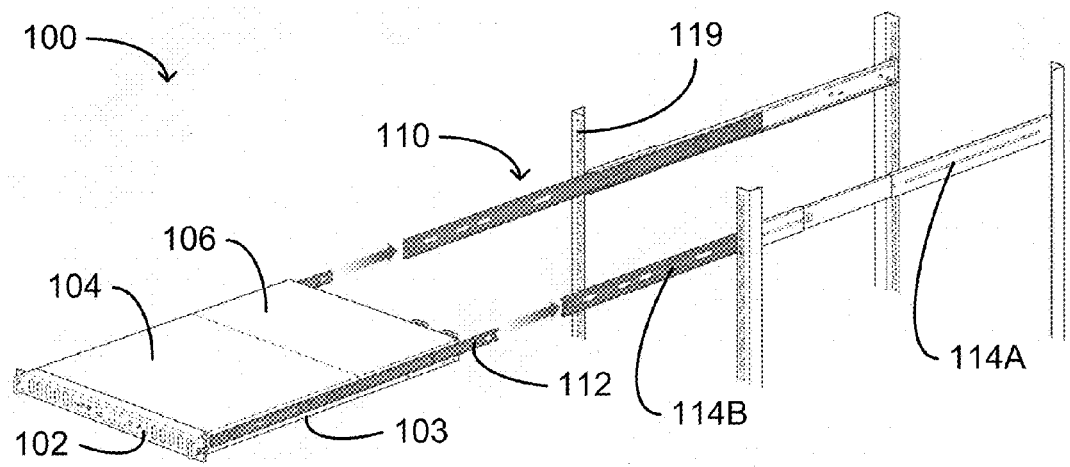

| | | | |
|---|---|---|---|
| 8,644,017 B2* | 2/2014 | Dunham et al. | 361/679.33 |
| 8,743,536 B2* | 6/2014 | Alo et al. | 361/679.33 |
| 8,749,966 B1* | 6/2014 | Boudreau et al. | 361/679.33 |
| 8,793,413 B2* | 7/2014 | Morgan et al. | 710/62 |
| 8,925,739 B2* | 1/2015 | Crippen et al. | 211/26 |
| 2003/0007339 A1* | 1/2003 | Harris et al. | 361/788 |
| 2003/0112596 A1* | 6/2003 | Shih | 361/685 |
| 2004/0257763 A1* | 12/2004 | Andresen et al. | 361/687 |
| 2005/0259397 A1* | 11/2005 | Bash et al. | 361/699 |
| 2006/0002077 A1* | 1/2006 | Carlson et al. | 361/685 |
| 2006/0050487 A1* | 3/2006 | Wu et al. | 361/724 |
| 2007/0206368 A1* | 9/2007 | Zhang et al. | 361/801 |
| 2007/0230111 A1* | 10/2007 | Starr et al. | 361/685 |
| 2007/0247805 A1* | 10/2007 | Fujie et al. | 361/687 |
| 2008/0158818 A1* | 7/2008 | Clidaras et al. | 361/699 |
| 2009/0097200 A1* | 4/2009 | Sharma et al. | 361/688 |
| 2009/0109609 A1* | 4/2009 | Lai et al. | 361/679.39 |
| 2009/0161309 A1* | 6/2009 | Yang | 361/679.39 |
| 2009/0186494 A1* | 7/2009 | Bell et al. | 439/65 |
| 2009/0271551 A1* | 10/2009 | Cheng | 710/301 |
| 2009/0323274 A1* | 12/2009 | Lin | 361/679.48 |
| 2010/0027213 A1* | 2/2010 | Wu et al. | 361/679.39 |
| 2010/0153608 A1* | 6/2010 | Olesiewicz et al. | 710/303 |
| 2010/0214733 A1* | 8/2010 | Suffern et al. | 361/679.46 |
| 2011/0007464 A1* | 1/2011 | Leigh | 361/679.01 |
| 2011/0032686 A1* | 2/2011 | Lin | 361/801 |
| 2011/0102999 A1* | 5/2011 | Liu et al. | 361/679.33 |
| 2011/0116226 A1* | 5/2011 | Yang | 361/679.48 |
| 2011/0128687 A1* | 6/2011 | Chen et al. | 361/679.02 |
| 2011/0157810 A1* | 6/2011 | Lin | 361/679.32 |
| 2011/0182028 A1* | 7/2011 | Tan et al. | 361/679.46 |
| 2011/0182045 A1* | 7/2011 | Gunderson et al. | 361/757 |
| 2011/0184568 A1* | 7/2011 | Tai et al. | 700/282 |
| 2012/0069514 A1* | 3/2012 | Ross | 361/679.33 |
| 2012/0134100 A1* | 5/2012 | Zhang | 361/679.39 |
| 2012/0155009 A1* | 6/2012 | Lai | 361/679.33 |
| 2012/0252344 A1* | 10/2012 | Chien et al. | 454/184 |
| 2013/0120927 A1* | 5/2013 | Wen et al. | 361/679.39 |
| 2013/0128436 A1* | 5/2013 | Chang | 361/679.02 |
| 2013/0161277 A1* | 6/2013 | Augsburger et al. | 211/175 |
| 2013/0220952 A1* | 8/2013 | Zhou | 211/26 |

OTHER PUBLICATIONS

AAEON Electronics, Inc., CRS-300-2R product image, accessed Sep. 5, 2103 (www.aaeonsystems.com/media/1748/1786.jpg).

Quanta Computer Inc., Revolutionary Storage for Big Data, accessed Sep. 5, 2013 (www.rackmountpro.com/product/pdf/S100-L11SL__ds2.pdf).

Quanta Computer Inc., STRATOS S100 Series S100-L11SL datasheet, Aug. 13, 2012, accessed Sep. 5, 2103 (www.guantaqct.com/en/02__support/02__download.php).

Quanta Computer Inc., S100-L11SL product image, accessed Sep. 5, 2013 (www.rackmountpro.com/product/imgl/S100-L11SL__T1.jpg).

Seagate Technology LLC, Seagate Enters Rackmount NAS Market With Innovative 8-Bay 1U Design, Sep. 9, 2013, 2 pages, accessed Oct. 11, 2013 (www.seagate.com/about/newsroom/press-releases/seagate-enters-rackmount-nas-market-with-innovative-8-bay-1u-design-master-pr/?paramChannelName=newsroom).

Seagate Technology LLC, Business Storage 8-Bay Rackmount NAS, Features, Sep. 9, 2013, 6 pages, accessed Oct. 11, 2013 (www.seagate.com/external-hard-drives/network-storage/business/business-storage-8-bay-rackmount-nas/#features).

Seagate Technology LLC, Business Storage 8-Bay Rackmount NAS, Specs, Sep. 9, 2013, 6 pages, accessed Oct. 11, 2013 (www.seagate.com/external-hard-drives/network-storage/business/business-storage-8-bay-rackmount-nas/#specs).

Seagate Technology LLC, Table contents from Business Storage 8-Bay Rackmount NAS, Specs, Sep. 9, 2013, 3 pages, accessed Oct. 14, 2013 (www.seagate.com/external-hard-drives/network-storage/business/business-storage-8-bayrackmount-nas/#specs).

Seagate Technology LLC, Business Storage 8-Bay Rackmount Data Sheet, Sep. 9, 2013, 2 pages, accessed Oct. 11, 2013 (www.seagate.com/www-content/product-content/seagate-business-fam/business-storage-8-bay-rackmount-nas/en-us/docs/business-storage-8-bay-rackmount-nas-ds1799-1-1307us.pdf).

* cited by examiner

CHASSIS FOR STORAGE DEVICES

BACKGROUND

A rack-mounted storage system may utilize a number of digital data storage devices (e.g., hard disk drives) in an array for a large data storage capacity. While sizeable data storage capacities have been realized for rack-mounted storage systems, such rack-mounted storage systems fail to achieve arrays of digital data storage devices that are both cost-effective and easily serviced. Difficulties in servicing digital data storage devices in rack-mounted storage systems may cause excessive downtime during service, such as when one or more digital data storage devices of an array fail and need replacement. The excessive downtime may degrade the usefulness of the rack-mounted storage system to the operator and may cause an inconvenience to the operator and/or end users who desire access to digital data stored on the rack-mounted storage system.

SUMMARY

Provided herein is an apparatus, including a chassis defining a storage compartment; a printed circuit board, wherein the printed circuit board is substantially parallel to a floor of the storage compartment; and a number of connectors mounted on the printed circuit board, wherein the number of connectors are configured to respectively connect to a number of digital data storage devices oriented substantially parallel to the printed circuit board.

These and other features and aspects of the concepts presented herein may be better understood with reference to the following drawings, description, and appended claims.

DRAWINGS

FIG. 1A provides an exploded view of a rack-mountable chassis/storage system and a rack in accordance with an embodiment.

Figure 1B:
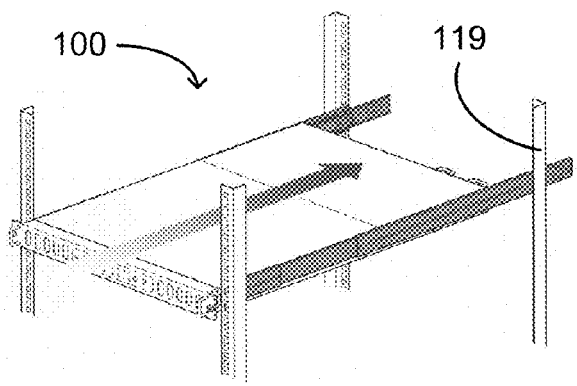

FIG. 1B provides a perspective view of a rack-mounted chassis/storage system mounted in a rack in accordance with an embodiment.

Figure 2A:
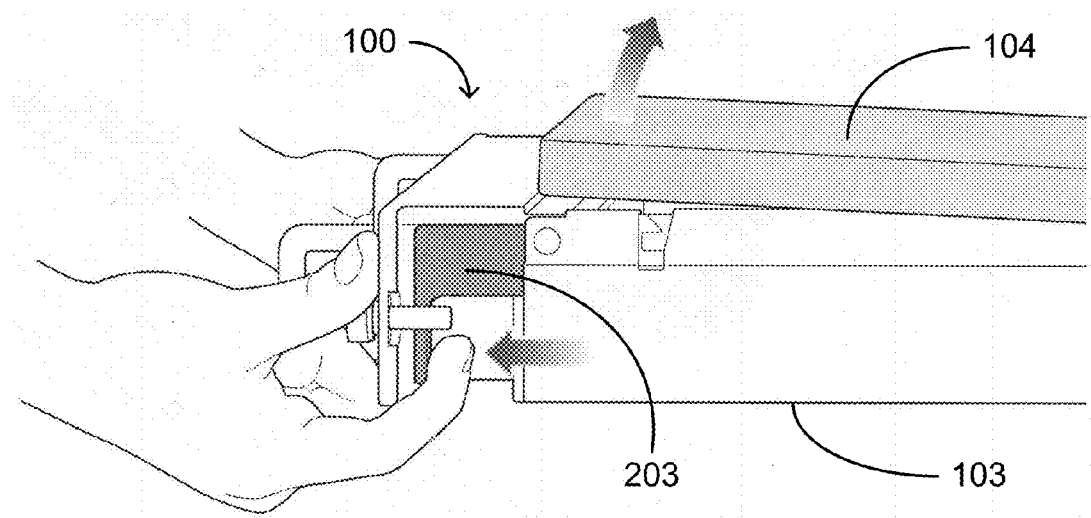

FIG. 2A provides a close-up view of a rack-mountable chassis/storage system including a storage compartment cover in accordance with an embodiment.

Figure 2B:
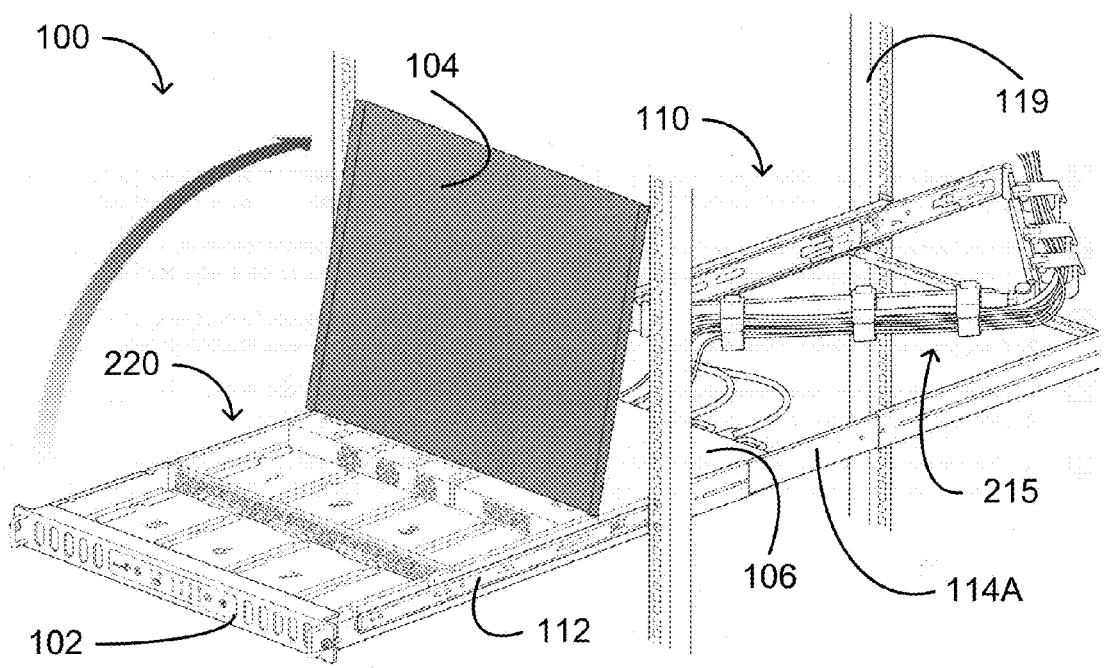

FIG. 2B provides a perspective view of a rack-mounted chassis including an open storage compartment cover in accordance with an embodiment.

Figure 2C:
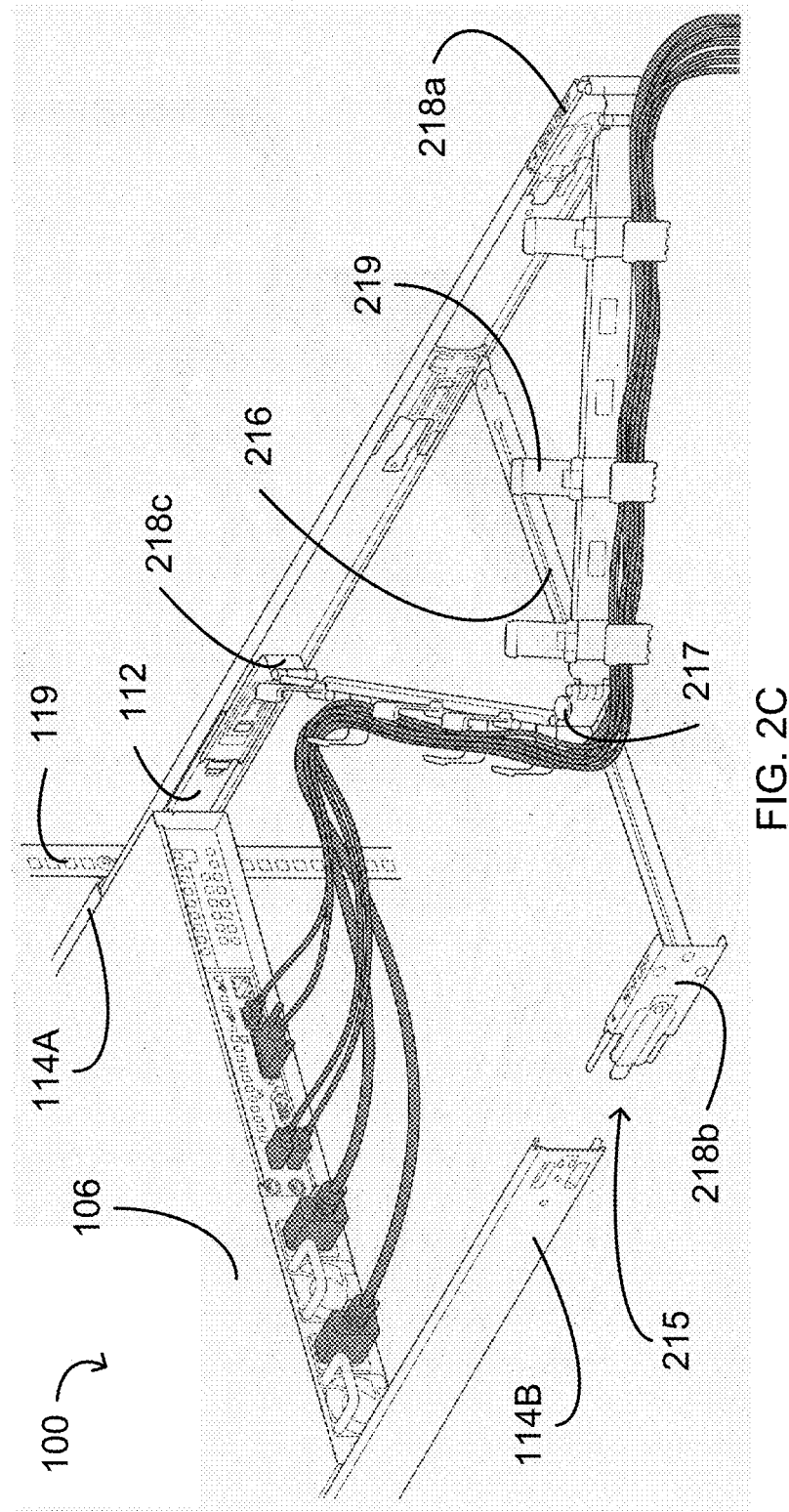

FIG. 2C provides a perspective view of a rack-mounted chassis/storage system including a cable management system in accordance with an embodiment.

Figure 3A:
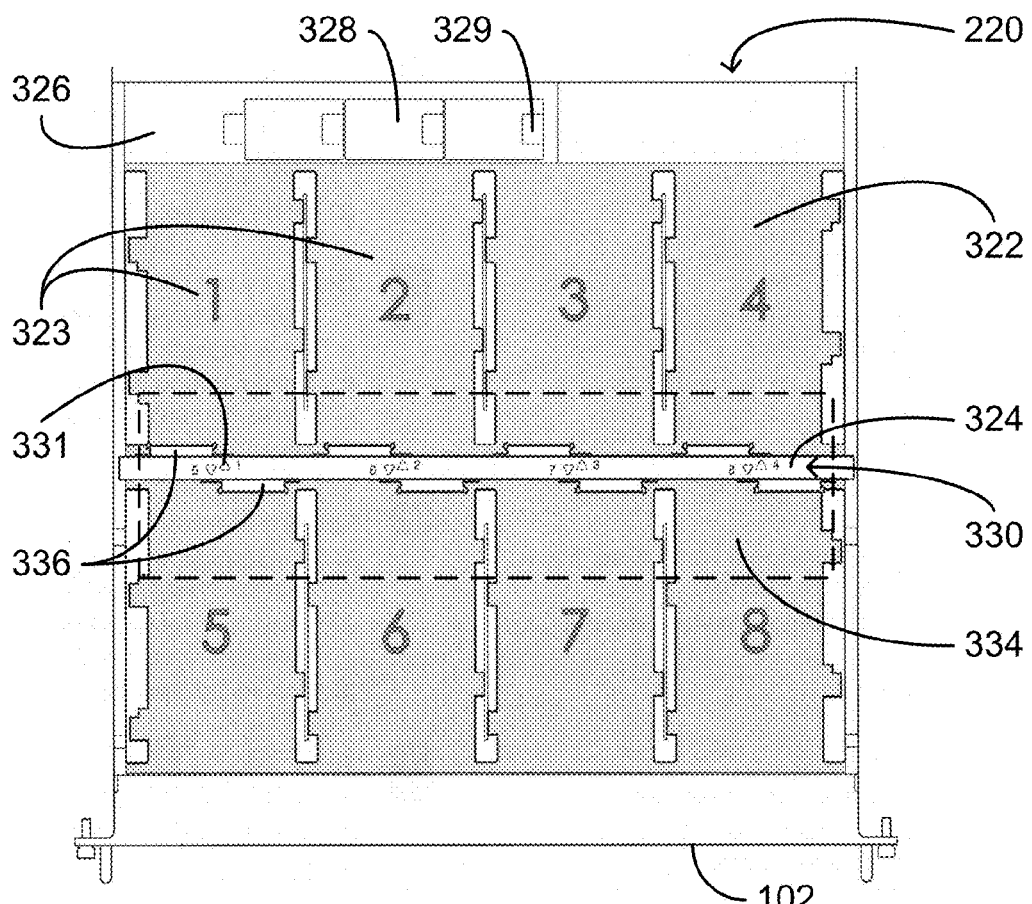

FIG. 3A provides a plan view of a storage compartment of a rack-mountable chassis in accordance with an embodiment.

Figure 3B:
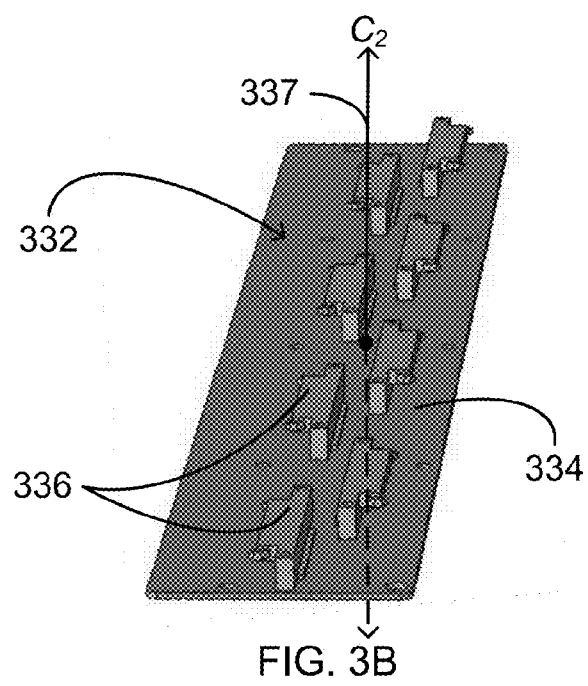

FIG. 3B provides a perspective view of a printed circuit board assembly with a number of connectors for respectively connecting a number of digital data storage devices in accordance with an embodiment.

FIGS. 4A-4D provide perspective views of a digital data storage device and/or a rack-mounted chassis/storage system in accordance with an embodiment.

Figure 5:
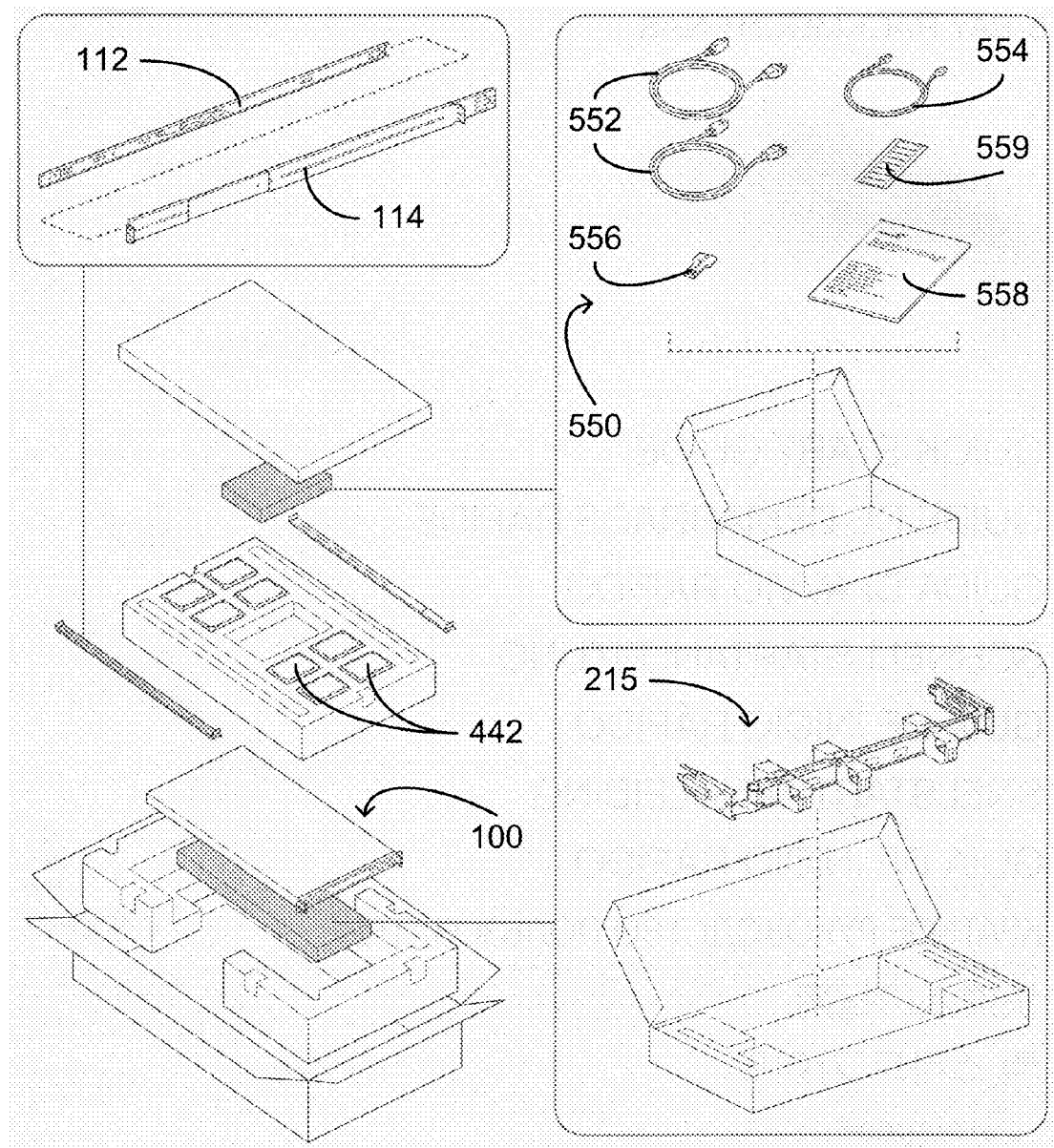

FIG. 5 provides a kit including a rack-mountable chassis and a number of digital data storage devices in accordance with an embodiment.

DESCRIPTION

Before some embodiments are described in greater detail, it should be understood by persons having ordinary skill in the art that the particular embodiments described and/or illustrated herein are not limiting, as elements in such embodiments may vary. It should likewise be understood that a particular embodiment described and/or illustrated herein has elements which may be readily separated from the particular embodiment and optionally combined with any of several other embodiments or substituted for elements in any of several other embodiments described herein.

It should also be understood by persons having ordinary skill in the art that the terminology used herein is for the purpose of describing some embodiments, and the terminology is not intended to be limiting. Unless indicated otherwise, ordinal numbers (e.g., first, second, third, etc.) are used to distinguish or identify different elements or steps in a group of elements or steps, and do not supply a serial or numerical limitation. For example, "first," "second," and "third" elements or steps need not necessarily appear in that order, and embodiments need not necessarily be limited to the three elements or steps. It should also be understood that, unless indicated otherwise, any labels such as "left," "right," "front," "back," "top," "bottom," "forward," "reverse," "clockwise," "counter clockwise," "up," "down," or other similar terms such as "upper," "lower," "aft," "fore," "vertical," "horizontal," "proximal," "distal," and the like are used for convenience and are not intended to imply, for example, any particular fixed location, orientation, or direction. Instead, such labels are used to reflect, for example, relative location, orientation, or directions. It should also be understood that the singular forms of "a," "an," and "the" include plural references unless the context clearly dictates otherwise.

Unless defined otherwise, all technical and scientific terms used herein have the same meaning as commonly understood by persons of ordinary skill in the art.

A rack-mounted storage system may utilize a number of digital data storage devices (e.g., hard disk drives) in an array for a large data storage capacity. While sizeable data storage capacities have been realized for rack-mounted storage systems, such rack-mounted storage systems fail to achieve arrays of digital data storage devices that are both cost-effective and easily serviced. Difficulties in servicing digital data storage devices in rack-mounted storage systems may cause excessive downtime during service, such as when one or more digital data storage devices of an array fail and need replacement. The excessive downtime may degrade the usefulness of the rack-mounted storage system to the operator and may cause an inconvenience to the operator and/or end users who desire access to digital data stored on the rack-mounted storage system. Provided herein are rack-mountable chassis for storage systems and rack-mountable storage systems that are cost-effective and/or easily serviced; however, the rack-mountable chassis for storage systems and rack-mountable storage systems provided herein are not limited to being cost-effective and/or easily serviced, as other features and aspects of the rack-mountable chassis for storage systems and rack-mountable storage systems are also provided herein.

A rack-mountable apparatus, such as a rack-mountable chassis or a rack-mountable storage system, may include an apparatus configured for mounting in a rack, whereas a rack-mounted apparatus, such as a rack-mounted chassis or a rack-mounted storage system, may include an apparatus mounted in a rack. As such, rack-mountable and rack-mounted may provide a context or an environment for the apparatus and need not limit the apparatus. A chassis, such as a rack-mountable chassis or a rack-mounted chassis, may include an apparatus configured for mounting in a rack or an apparatus mounted in a rack, wherein the apparatus may or may not contain one or more digital data storage devices. A storage system, such as a rack-mountable storage system or a rack-mounted storage system, may include an apparatus configured for mounting in a rack or an apparatus mounted in a rack, wherein the apparatus contains one or more digital data storage devices. A rack may include a frame or an enclosure (e.g., cabinet housing a frame) configured for mounting one or more rack-mountable apparatuses, such as rack-mountable chassis or rack-mountable storage systems. For example, a rack may be a 4-post, 19-inch rack standardized in accordance with standards from the Electronic Industries Alliance (e.g., EIA-310-D), the Consumer Electronics Association (e.g., CEA-310-E), and/or the International Electrotechnical Commission, wherein the rack may have depth-adjustable rear posts for accommodating deep rack-mountable apparatuses, and wherein the rack may have a height of up to 42 U. A rack unit ("RU" or "U") includes a unit of measure used with racks for the height of rack-mountable apparatuses, such as rack-mountable chassis or rack-mountable storage systems. One rack unit or 1 U measures 1.75 inches in height; two rack units or 2 U measures 3.50 inches in height; three rack units or 3 U measures 5.25 inches in height; four rack units or 4 U measures 7.00 inches in height; etc. For example, rack-mountable apparatuses, such as rack-mountable chassis or rack-mountable storage systems described herein, may have a height of 1 U or a 1 U form factor.

FIG. 1A provides an exploded view of a rack-mountable chassis/storage system and a rack in accordance with an embodiment, and FIG. 1B provides a perspective view of a rack-mounted chassis/storage system mounted in the rack in accordance with an embodiment. As illustrated, the rack-mountable chassis/storage system 100 may include a faceplate 102, which faceplate may have a power button to power the rack-mountable chassis/storage system 100 on and off; one or more indicator lights for network status and/or activity when the rack-mountable chassis/storage system 100 is configured for network-attached storage; and/or a number of indicator lights respectively for a number of digital data storage devices and their status and/or activity. In addition, the faceplate 102 may have a front-facing Universal Serial Bus ("USB") port (e.g., USB 2.0 port, USB 3.0 port, USB 3.1 port, etc.) for easily accessed USB connectivity including that for hardware key or dongle access. The rack-mountable chassis/storage system 100 may provide an enclosure including a storage compartment for a number of digital data storage devices and a motherboard compartment for a motherboard, wherein the motherboard compartment may include a number of bays (e.g., two bays) for hot-swappable power supplies (e.g., dual hot-swappable power supplies set up for failover or switchover) for the rack-mountable chassis/storage system 100, which hot-swappable power supplies may respectively include cooling systems having one or more fans. The motherboard in the motherboard compartment may include a central processing unit ("CPU") such as a multi-core CPU (e.g., 2.3 GHz dual-core Intel® processor) and/or one or more units of Random-Access Memory ("RAM") such as Error-Correcting Code ("ECC") RAM (e.g., one unit of 4 GB ECC RAM), which multi-core CPU and one or more units or RAM may be configured for transferring data at 200 MB/s or more. As illustrated in FIG. 1A, the storage compartment may be covered by a storage compartment cover 104, and the motherboard compartment may be covered by a motherboard compartment cover 106.

The rack-mountable chassis/storage system 100 provided in FIG. 1A may further include a rail assembly 110 including inner rails 112 and outer rails 114 for mounting the rack-mountable chassis/storage system 100 in a rack 119, such as a 4-post, 19-inch rack. Each of the inner rails 112 may be directly fastened to the rack-mountable chassis/storage system 100 with fasteners (e.g., screws, bolts, etc.) to provide an assembly including the rack-mountable chassis/storage system 100 and the inner rails 112. With respect to the outer rails 114, each of the outer rails 114 may include an outer rail section 114A, which outer rail section 114A may be directly fastened to the rack 119 with fasteners (e.g., screws, bolts, retention clips, etc.). Each of the outer rails 114 may further include an outer rail section 114B, optionally a depth-adjustable outer rail section 114B, which outer rail section 114B may be slideably attached within the outer rail section 114A. The assembly including the rack-mountable chassis/storage system 100 and the inner rails 112 may be removably attached within the outer rails 114, such as within section 114B of the outer rails 114, using rail fasteners (e.g., slide latches) on the inner rails 112.

FIG. 2A provides a close-up view of a rack-mountable chassis/storage system including a storage compartment cover in accordance with an embodiment. As illustrated, the rack-mountable chassis/storage system 100 may include a latching system with a pair of latches 203 for latching/unlatching the storage compartment cover 104, which storage compartment cover 104 may be hinged at an end of the storage compartment cover 104 opposite the pair of latches 203. The rail assembly 110 (see FIGS. 1A and 1B), which allows a rack-mounted chassis/storage system 100 to be easily drawn out of a rack (e.g., 19-inch rack), in combination with the foregoing latching system, provides easy access to the storage compartment of the rack-mounted chassis/storage system 100 for service of components (e.g., digital data storage devices, fans, etc.) therein.

FIG. 2B provides a perspective view of a rack-mounted chassis including an open storage compartment cover in accordance with an embodiment. As illustrated, the rack-mounted chassis 100 may be drawn out of the rack 119 (e.g., 19-inch rack) and the storage compartment cover 104 may be raised providing easy access to a storage compartment 220. As described further in reference to FIG. 3A, the storage compartment 220 may include a number of fans and/or a number of bays respectively for a number of digital data storage devices, such as hard disk drives (e.g., 3.5-inch hard disk drives), solid state drives, hybrid drives, etc. As further illustrated in FIG. 2B, the rail assembly 110 may further include a cable management system 215 for managing one or more cables connected to an appropriate connector at a rear end (opposite the faceplate 102) of the rack-mounted chassis 100 including, but not limited to, power cables; network cables, such as Ethernet cables (e.g., Gigabit Ethernet cables); Serial Advance Technology Attachment ("SATA") or external Serial Advance Technology Attachment ("eSATA") cables; USB cables; user-input-related cables, such as Personal System/2 ("PS/2") mouse and keyboard cables; monitor cables, such as Video Graphics Array ("VGA") cables, Digital Visual Interface ("DVI") cables, and High-Definition Multimedia Interface ("HDMI") cables; and serial communications cables, such as DE-9 cables.

FIG. 2C provides a perspective view of a rack-mounted chassis/storage system including a cable management system in accordance with an embodiment. As even further illustrated in FIG. 2C the cable management system 215 may include a cross bar 216; a slider 217; connectors 218a, 218b, and 218c; and clasps 219 for holding and/or managing cables on the cable management system 215. Each of the connectors 218a and 218b connects or attaches the cable management system 215 to a different outer rail 114 (see outer rail section 114B) of the rail assembly 110, and the connector 218c connects or attaches the cable management system 215 to an inner rail 112 of the rail assembly 110, wherein the connectors 218a and 218c connect or attach the cable management system 215 on the same side of the rail assembly 110. When the rack-mounted chassis 100 is drawn out of the rack 119 (e.g., 19-inch rack), the cable management system 215 opens or extends such that the slider 217 slides along the cross bar 216 from the outer rail 114 of the rail assembly 110, to which connector 218b of the cable management system 215 is connected or attached, to the outer rail 114 and the inner rail 112 of the rail assembly 110, to which the connectors 218a and 218c of the cable management system 215 are respectively connected or attached. When the rack-mounted chassis 100 is inserted into the rack 119 (e.g., 19-inch rack), the cable management system 215 closes or condenses such that the slider 217 slides along the cross bar 216 from the outer rail 114 and the inner rail 112 of the rail assembly 110, to which the connectors 218a and 218c of the cable management system 215 are respectively connected or attached, to the outer rail 114 of the rail assembly 110, to which the connector 218b of the cable management system 215 is connected or attached.

FIG. 3A provides a plan view of a storage compartment of a rack-mountable chassis in accordance with an embodiment. As illustrated, the storage compartment 220 may include a floor 322 having an array or a number of bays 323 respectively for an array or a number of digital data storage devices (e.g., hard disk drives such as 3.5-inch hard disk drives, solid state drives, hybrid drives, etc.). A rear of the storage compartment 220 may include a rear panel 326, which rear panel 326 separates the storage compartment 220 from the motherboard compartment (see the motherboard compartment cover 106 of FIG. 1A for location of the motherboard compartment), and which rear panel 326 houses a number of fans 328, such as, but not limited to, the three fans 328 provided in FIG. 3A. The number of fans 328 may be hot-swappable fans such that any fan of the number of fans 328 may be easily serviced (e.g., repaired or replaced) without having to power down the rack-mountable chassis 100. In addition, each of the number of fans 328 may include an ejection button 329 such that any fan of the number of fans 328 may be toollessly extracted (i.e., extracted without tools) from the rear panel 326 of the storage compartment 220. The ejection button 329 may be a mechanical button or, when depressed, the ejection button 329 may provide an electronic signal to an onboard processor, such as a central processing unit ("CPU") on the motherboard, in the motherboard compartment to power down and eject the respective fan.

The storage compartment 220 of the rack-mountable chassis 100 in FIG. 3A may further include a central partition 324, which central partition 324 provides a portion of a housing for an electrical connection system 330 for connecting a number of digital data storage devices (e.g., hard disk drives, solid state drives, hybrid drives, etc.) to the motherboard in the motherboard compartment of the rack-mountable chassis 100. The electrical connection system 330 may include a printed circuit board assembly 332 (see FIG. 3B) having a printed circuit board 334, a number of connectors 336 for respectively connecting the number of digital data storage devices, a number of cable connectors (not shown) on the printed circuit board 334, a number of cable connectors on the motherboard, and/or a number of connecting cables, wherein the number of connectors 336 respectively corresponds to the number of cable connectors on the printed circuit board 334, and wherein the number of cable connectors on the printed circuit board 334 respectively connects to the number of cable connectors on the motherboard with the connecting cables. The portion of the housing for electrical connection system 330 provided by the central partition 324 may include housing for the number of connectors 336 (e.g., right-angled connectors). As further illustrated in FIG. 3A, the printed circuit board 334 of the printed circuit board assembly 332 may be positioned beneath the floor 322 of the storage compartment 220 such that the floor 322 and a base or a bottom 103 (see FIG. 1A) of the rack-mountable chassis 100 provides another portion of the housing for the electrical connection system 330. Placing the printed circuit board 334 beneath the floor 322 of the storage compartment 220 such that the printed circuit board 334 is substantially parallel to the floor 322 allows for the remaining vertical space between the printed circuit board 334 (e.g., a bottom of the printed circuit board 334) and the base or the bottom 103 of the rack-mountable chassis 100 to be used for the number of connecting cables. The horizontal placement of the printed circuit board 334 beneath the floor 322 of the storage compartment 220 further allows for use of a single printed circuit board 334 with right-angled connectors 336 (e.g., right-angled SATA connectors having a data component and a power component) instead of a number of vertically placed printed circuit boards with straight connectors, which provides better air flow through the storage compartment 220 because the air flow is unimpeded by any vertically placed printed circuit boards.

FIG. 3B provides a perspective view of a printed circuit board assembly with a number of connectors for respectively connecting a number of digital data storage devices in accordance with an embodiment. As illustrated, the printed circuit board assembly 332 may include a number of connectors 336 for respectively connecting the number of digital data storage devices, wherein the number of connectors 336 may be right-angled connectors, and wherein the number of connectors 336 may be SATA connectors having a data component and a power component for respectively connecting a number of SATA-based digital data storage devices. The number of connectors 336 may be staggeredly mounted (i.e., mounted in a staggered or offset fashion) on the printed circuit board 334 providing a unique arrangement of the number of connectors 336 that allows for a surprisingly compact layout of the number of digital data storage devices. The unique arrangement of the number of connectors 336 may include staggeredly mounting the number of connectors 336 on the printed circuit board 334 such that the number of connectors 336, as a group, has 2-fold rotational symmetry or $C_2$ symmetry, wherein 2-fold rotational symmetry or $C_2$ symmetry indicates a symmetry operation in which 180° rotation of an object or a group of objects about an axis does not change the object or the group of objects. An example of such 2-fold rotational symmetry or $C_2$ symmetry is illustrated in FIG. 3B using rotational axis 337, wherein 180° rotation of the number of connectors 336, as a group, about the rotational axis 337 leaves the group of connectors 336 in a state indistinguishable from that prior to the symmetry operation (i.e., 180° rotation). While such 2-fold rotational symmetry or $C_2$ symmetry is a property of the group of connectors 336, the 2-fold rotational symmetry or $C_2$ symmetry property also exists for any staggered or offset pair of connectors 336 or for any multiples thereof. The pair of connectors 336 corresponding to Bay 1 and Bay 5 of the number of bays 323 of FIG. 3A, for example, exhibit 2-fold rotational symmetry or $C_2$ symmetry about an axis coincident with a surface normal located at or near indicator lights 331 (e.g., indicator lights for digital data storage devices and their status and/or activity) for Bay1 and Bay 5, wherein the surface of the surface normal is the floor 322 of the storage compartment 220. As further illustrated in the embodiment of FIG. 3A, the unique arrangement of the number of connectors 336 allows for a surprisingly compact layout of digital data storage devices, such as, but not limited to, the eight digital data storage devices respectively for Bays 1-8 of the number of bays 323.

Figure 4A:
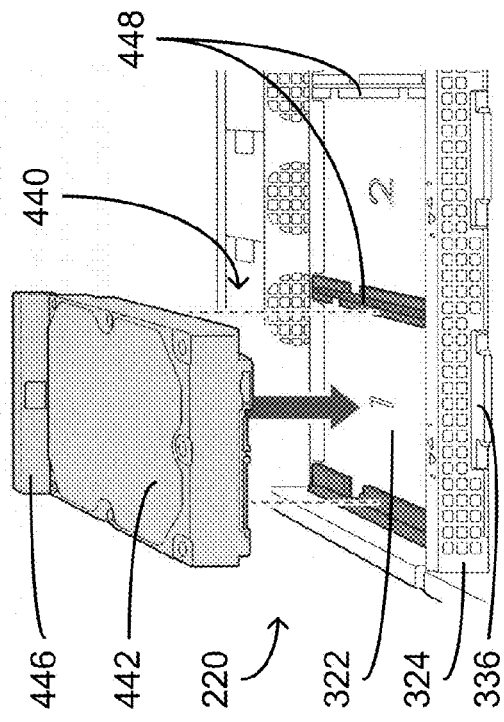
Figure 4B:
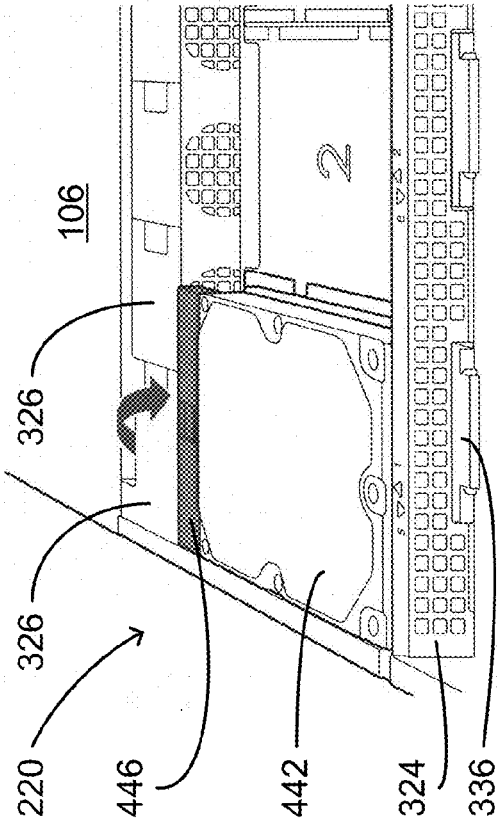
Figure 4C:
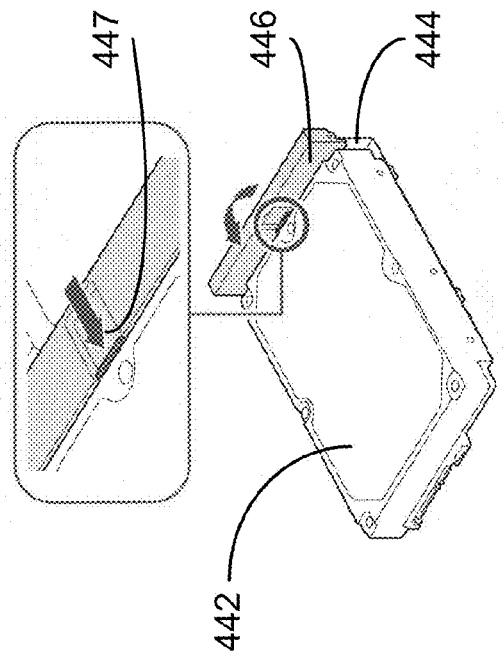
Figure 4D:
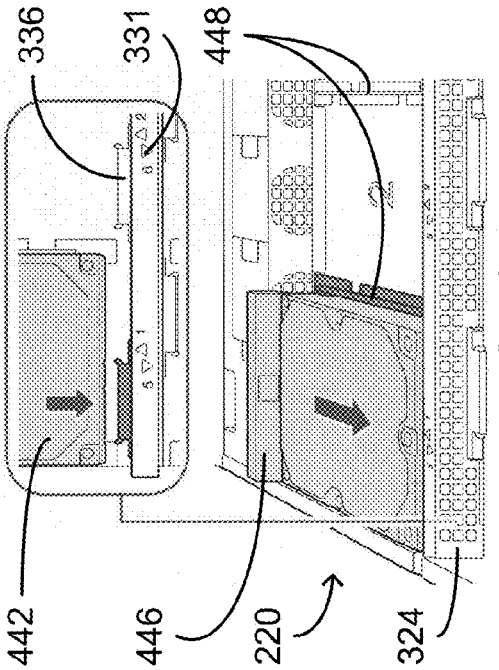

FIGS. 4A-4D provide perspective views of a digital data storage device and/or a rack-mounted chassis/storage system in accordance with an embodiment. As illustrated among FIGS. 4A-4D, the rack-mounted chassis/storage system 100 may include a mechanical connection system 440 configured to operate in concert with the electrical connection system 330 to facilitate connecting/disconnecting the number of digital data storage devices including hot swapping digital data storage devices, such as hard disk drives (e.g., SATA-based hard disk drives), solid state drives (e.g., SATA-based solid state drives), hybrid drives (e.g., SATA-based hybrid drives), etc. As illustrated in FIG. 4A, the mechanical connection system 440 may include a slider 444 for each digital data storage device, wherein the slider 444 has a rotatable latch 446 with a slideable lock 447 for locking the rotatable latch 446 in its limiting position (see FIG. 4A, top), and wherein the slider 444 may be removably fastened with fasteners (e.g., screws) to a digital data storage device 442 for a slider-digital data storage device assembly, such as a slider-hard disk drive assembly, a slider-solid state drive assembly, a slider-hybrid drive assembly, etc. With one or more pre-assembled slider-digital data storage device assemblies on hand, digital data storage devices may be toollessly hot swapped allowing digital data storage devices of the rack-mounted storage system 100 to be easily serviced (e.g., repaired or replaced) without having to power down the rack-mounted storage system 100. As illustrated in FIG. 4B, the mechanical connection system 440 may further include guides 448 mounted on the floor 322 of the storage compartment 220 for positioning the slider-digital data storage device assemblies in their respective bays 323 and for guiding the slider-digital data storage device assemblies in connecting with their respective connectors 336. As illustrated among FIGS. 4B and 4C, the slider-digital data storage device assembly with its rotatable latch 446 in its non-limiting position may be inserted into its respective bay 323 (e.g., Bay 1 of storage compartment 220) such that the slider 444 of the slider-digital data storage device assembly engages and/or interlocks with the guides 448. The slider-digital data storage device assembly may be subsequently slideably moved along the guides 448 toward its respective connector 336 until a communicative connection with the electrical connection system 330 is established. As illustrated among FIGS. 4C and 4D, once the communicative connection with the electrical connection system 330 is established, the rotatable latch 446 of the slider-digital data storage device assembly may be rotated from its non-limiting position (see FIG. 4C, bottom) to its limiting position (see FIG. 4D) and locked into position with the slideable lock 447. With the rotatable latch 446 locked in its limiting position, longitudinal movement of the slider-digital data storage device assembly in the storage compartment 220 is restricted, which maintains the communicative connection with the electrical connection system 330 when drawing the rack-mounted storage system 100 out of the rack (e.g., 19-inch rack) or during a seismic event.

FIG. 5 provides a kit including a rack-mountable chassis and a number of digital data storage devices in accordance with an embodiment. As illustrated, the kit may include the rack-mountable chassis 100; the rail assembly 110 including the inner rails 112, the outer rails 114, and the cable management system 215; the number of digital data storage devices (e.g., hard disk drives, solid state drives, hybrid drives, etc.) and the sliders 444 for mounting thereon, optionally pre-assembled as a number of slider-digital data storage device assemblies (e.g., slider-hard disk drive assemblies, slider-solid state drive assemblies, slider-hybrid drive assemblies, etc.); and hardware, such as, but not limited to, fasteners (e.g., screws, bolts, retention clips, etc.). As further illustrated in FIG. 5, the kit may optionally include one or more accessories 550 selected from power cables 552; an Ethernet cable 554; a hardware key or dongle 556; a manual or a guide 558; and identification stickers 559 for the digital data storage devices. The kit may be configured for packaging as illustrated in FIG. 5, which packaging facilitates palletization and shipping.

As such, provided herein is an apparatus, comprising a chassis defining a storage compartment; a printed circuit board, wherein the printed circuit board is substantially parallel to a floor of the storage compartment; and a plurality of connectors mounted on the printed circuit board, wherein the plurality of connectors are configured to respectively connect to a plurality of digital data storage devices oriented substantially parallel to the printed circuit board. In some embodiments, the plurality of connectors are staggeredly mounted on the printed circuit board with $C_2$ symmetry. In some embodiments, the apparatus further comprises a plurality of sliders configured to respectively fasten to a plurality of digital data storage devices and a plurality of guides mounted on the floor of the storage compartment, wherein the sliders and the guides facilitate hot swapping of digital data storage devices. In some embodiments, the storage compartment further comprises a plurality of hot-swappable fans for cooling the storage compartment. In some embodiments, the printed circuit board is positioned beneath the floor of the storage compartment. In some embodiments, the apparatus further comprises a motherboard compartment, wherein the plurality of connectors mounted on the printed circuit board are respectively connected to a plurality of connectors mounted on a motherboard in the motherboard compartment by cables positioned under the floor of the storage compartment. In some embodiments, the chassis comprises a 1 U chassis configured for mounting in a 4-post, 19-inch rack on a rail assembly.

Also provided herein is an apparatus, comprising a chassis providing an enclosure; a storage compartment of the enclosure for housing a plurality of digital data storage devices; and a printed circuit board assembly ("PCBA") comprising a printed circuit board and a plurality of PCBA connectors for respectively connecting a plurality of digital data storage devices, wherein the printed circuit board is substantially parallel with a floor of the storage compartment, and wherein the plurality of PCBA connectors are staggeredly arranged on the printed circuit board with 2-fold rotational symmetry. In some embodiments, each connector of the plurality of PCBA connectors comprises a Serial Advance Technology Attachment connector with a data component and a power component. In some embodiments, the apparatus further comprises a plurality of sliders configured to respectively fasten to a plurality of digital data storage devices and a plurality of guides mounted on the floor of the storage compartment, wherein the sliders and the guides facilitate hot swapping of digital data storage devices. In some embodiments, the storage compartment further comprises a plurality of hot-swappable fans for cooling the storage compartment. In some embodiments, the printed circuit board is positioned beneath the floor of the storage compartment. In some embodiments, the apparatus further comprises a motherboard compartment of the enclosure for housing a motherboard, wherein the plurality of PCBA connectors are respectively connected to a plurality of motherboard connectors by cables positioned under the floor of the storage compartment. In some embodiments, the chassis comprises a 1-rack unit chassis configured for mounting in a 4-post, 19-inch rack on a rail assembly. In some embodiments, the apparatus further comprises a cable management system for managing power and network cables, wherein the cable management system is coupled to the rail assembly.

Also provided herein is an apparatus, comprising a chassis providing an enclosure; a plurality of digital data storage devices positioned in a storage compartment of the enclosure; and a printed circuit board assembly ("PCBA") comprising a printed circuit board and a plurality of PCBA connectors for respectively connecting the plurality of digital data storage devices, wherein the printed circuit board is substantially parallel with a floor of the storage compartment, and wherein the plurality of PCBA connectors are staggeredly arranged on the printed circuit board with $C_2$ symmetry. In some embodiments, the apparatus further comprises a plurality of sliders respectively fastened to the plurality of digital storage devices and a plurality of guides mounted on the floor of the storage compartment, wherein the plurality of sliders and the plurality of guides facilitate hot swapping of the plurality of digital data storage devices. In some embodiments, the storage compartment further comprises a plurality of hot-swappable fans for cooling the storage compartment. In some embodiments, the printed circuit board is positioned beneath the floor of the storage compartment. In some embodiments, the apparatus further comprises a motherboard compartment of the enclosure for housing a motherboard, wherein the plurality of PCBA connectors are respectively connected to a plurality of motherboard connectors by cables positioned under the floor of the storage compartment. In some embodiments, the chassis comprises a 1 U chassis configured for mounting in a 4-post, 19-inch rack on a rail assembly. In some embodiments, the apparatus further comprises a cable management system for managing power and network cables, wherein the cable management system is coupled to the rail assembly.

Also provided herein is an apparatus, comprising a chassis providing an enclosure; a storage compartment of the enclosure for housing a plurality of digital data storage devices; and a printed circuit board assembly ("PCBA") comprising a plurality of PCBA connectors arranged on a printed circuit board for respectively connecting a plurality of digital data storage devices, wherein the plurality of PCBA connectors are staggeredly arranged on the printed circuit board with 2-fold rotational symmetry. In some embodiments, the storage compartment further comprises a plurality of hot-swappable fans for cooling the storage compartment. In some embodiments, the printed circuit board is substantially parallel with a floor of the storage compartment. In some embodiments, the apparatus further comprises a motherboard compartment of the enclosure for housing a motherboard, wherein the plurality of PCBA connectors are respectively connected to a plurality of motherboard connectors by cables positioned under a floor of the storage compartment. In some embodiments, the chassis comprises a 1-rack unit chassis configured for mounting in a 4-post, 19-inch rack on a rail assembly.

Also provided herein is an apparatus, comprising a rack-mount chassis; a storage compartment defined by the rack-mount chassis for housing a plurality of storage devices substantially parallel to a floor of the storage compartment; and a plurality of substantially right-angled connectors mounted on a printed circuit board configured to respectively attach a plurality of storage devices to the printed circuit board, wherein the printed circuit board is substantially parallel to the floor of the storage compartment. In some embodiments, the plurality of substantially right-angled connectors are staggeredly mounted on the printed circuit board with $C_2$ symmetry. In some embodiments, the storage compartment further comprises a plurality of hot-swappable fans. In some embodiments, the printed circuit board is positioned beneath the floor of the storage compartment. In some embodiments, the apparatus further comprises a motherboard compartment defined by the rack-mount chassis, wherein the plurality of substantially right-angled connectors mounted on the printed circuit board are respectively attached to a plurality of connectors mounted on a motherboard in the motherboard compartment by cables positioned under the floor of the storage compartment. In some embodiments, the chassis comprises a 1 U chassis configured for mounting in a 4-post rack on a rail assembly.

While some embodiments have been described and/or illustrated herein, and while these particular embodiments have been described and/or illustrated in considerable detail, it is not the intention of the applicant(s) for these particular embodiments to be limiting. Additional adaptations and/or modifications may readily appear to persons having ordinary skill in the art, and, in broader aspects, these adaptations and/or modifications may be also encompassed. Accordingly, departures may be made from the foregoing embodiments without departing from the scope of the concepts presented herein, which scope is limited only by the following claims when appropriately construed.

What is claimed is:

1. An apparatus, comprising
a chassis defining a storage compartment;
a printed circuit board,
   wherein the printed circuit board is substantially parallel to a floor of the storage compartment,
   wherein the floor is configured to support a plurality of digital data storage devices on one side of the floor and the printed circuit board on the opposite side of the floor; and
a plurality of connectors mounted on the printed circuit board,
   wherein the plurality of connectors are configured to respectively connect to a plurality of digital data storage devices oriented substantially parallel to the printed circuit board.

2. The apparatus of claim 1,
wherein the plurality of connectors are staggeredly mounted on the printed circuit board with $C_2$ symmetry.

3. The apparatus of claim 1, further comprising
a plurality of sliders configured to respectively fasten to a plurality of digital data storage devices and
a plurality of guides mounted on the one side of the floor,
   wherein the sliders and the guides facilitate hot swapping of digital data storage devices.

4. The apparatus of claim 1, further comprising
a motherboard compartment separated from the storage compartment by a rear panel of the storage compartment,
   wherein the plurality of connectors mounted on the printed circuit board are respectively connected to a plurality of connectors mounted on a motherboard in the motherboard compartment by cables positioned adjacent to the opposite side of the floor.

5. The apparatus of claim 4,
wherein the storage compartment further comprises a plurality of hot-swappable fans mounted in the rear panel for cooling the storage compartment.

6. The apparatus of claim 3,
wherein the chassis comprises a 1 U chassis configured for mounting in a 4-post, 19-inch rack on a rail assembly.

7. An apparatus, comprising
a chassis providing an enclosure;
a storage compartment of the enclosure, wherein a floor of the storage compartment is configured to bear a plurality of digital data storage devices on a first side of the floor; and a printed circuit board assembly ("PCBA") comprising a printed circuit board and a plurality of PCBA connectors for respectively connecting a plurality of digital data storage devices, wherein the printed circuit board is substantially parallel with a second side of the floor opposite the first side of the floor, and wherein the plurality of PCBA connectors are staggeredly arranged on the printed circuit board with 2-fold rotational symmetry.

8. The apparatus of claim 7, further comprising
a plurality of sliders configured to respectively fasten to a plurality of digital data storage devices and
a plurality of guides mounted on the first side of the floor, wherein the sliders and the guides facilitate hot swapping of digital data storage devices.

9. The apparatus of claim 8,
wherein the storage compartment further comprises a plurality of hot-swappable fans mounted in a rear panel of the storage compartment for cooling the storage compartment.

10. The apparatus of claim 9, further comprising
a motherboard compartment of the enclosure for housing a motherboard,
wherein the motherboard compartment is separated from the storage compartment by the rear panel of the storage compartment, and
wherein the plurality of PCBA connectors are respectively connected to a plurality of motherboard connectors by cables positioned adjacent to the second side of the floor.

11. The apparatus of claim 7,
wherein the chassis comprises a 1-rack unit chassis configured for mounting in a 4-post, 19-inch rack on a rail assembly.

12. The apparatus of claim 11, further comprising
a cable management system for managing power and network cables,
wherein the cable management system is coupled to the rail assembly.

13. An apparatus, comprising
a rack-mount chassis;
a storage compartment defined by the rack-mount chassis for housing a plurality of storage devices substantially parallel and immediately adjacent to a first side of a floor of the storage compartment; and a plurality of substantially right-angled connectors mounted on a printed circuit board configured to respectively attach a plurality of storage devices to the printed circuit board, wherein the printed circuit board is substantially parallel and immediately adjacent to a second side of the floor opposite the first side of the floor.

14. The apparatus of claim 13,
wherein the plurality of substantially right-angled connectors are staggeredly mounted on the printed circuit board with $C_2$ symmetry.

15. The apparatus of claim 13,
wherein the storage compartment further comprises a plurality of hot-swappable fans mounted in a rear panel of the storage compartment.

16. The apparatus of claim 13, further comprising
a motherboard compartment defined by the rack-mount chassis,
wherein the motherboard compartment is separated from the storage compartment by a rear panel of the storage compartment, and
wherein the plurality of substantially right-angled connectors mounted on the printed circuit board are respectively attached to a plurality of connectors mounted on a motherboard in the motherboard compartment by cables positioned adjacent to the second side of the floor.

17. The apparatus of claim 13,
wherein the chassis comprises a 1 U chassis configured for mounting in a 4-post rack on a rail assembly.

18. The apparatus of claim 9, further comprising
a motherboard compartment of the enclosure for housing a motherboard,
wherein the motherboard compartment is separated from the storage compartment by the rear panel of the storage compartment, and
wherein the motherboard compartment comprises a pair of hot-swappable power supplies configured for failover.

19. The apparatus of claim 18,
wherein each power supply of the pair of hot-swappable power supplies comprises a cooling system comprising one or more fans.

20. The apparatus of claim 6,
wherein the storage compartment is configured for housing eight 3.5-inch hard disk drives.

* * * * *